(12) United States Patent
Bu et al.

(10) Patent No.: US 9,484,204 B2
(45) Date of Patent: Nov. 1, 2016

(54) TRANSISTOR AND METHOD FOR FORMING THE SAME

(71) Applicant: Semiconductor Manufacturing International (Shanghai) Corporation, Shanghai (CN)

(72) Inventors: Weihai Bu, Shanghai (CN); Jin Kang, Shanghai (CN); Yong Chen, Shanghai (CN); Xinpeng Wang, Shanghai (CN)

(73) Assignee: SEMICONDUCTOR MANUFACTURING INTERNATIONAL (SHANGHAI) CORPORATION, Shanghai (CN)

( * ) Notice: Subject to any disclaimer, the term of this patent is extended or adjusted under 35 U.S.C. 154(b) by 0 days.

(21) Appl. No.: 14/288,627

(22) Filed: May 28, 2014

(65) Prior Publication Data

US 2015/0145054 A1    May 28, 2015

(30) Foreign Application Priority Data

Nov. 27, 2013   (CN) .......................... 2013 1 0617916

(51) Int. Cl.
| | |
|---|---|
| *H01L 29/78* | (2006.01) |
| *H01L 21/28* | (2006.01) |
| *H01L 29/66* | (2006.01) |
| *H01L 21/02* | (2006.01) |
| *H01L 21/311* | (2006.01) |
| *H01L 21/3213* | (2006.01) |
| *H01L 29/51* | (2006.01) |

(52) U.S. Cl.
CPC ..... *H01L 21/28008* (2013.01); *H01L 21/0228* (2013.01); *H01L 21/02181* (2013.01); *H01L 21/28194* (2013.01); *H01L 21/31122* (2013.01); *H01L 21/31144* (2013.01); *H01L 21/32139* (2013.01); *H01L 29/517* (2013.01); *H01L 29/66477* (2013.01); *H01L 29/66545* (2013.01); *H01L 29/78* (2013.01)

(58) Field of Classification Search
CPC ..................... H01L 29/66545; H01L 21/0228
See application file for complete search history.

(56) References Cited

U.S. PATENT DOCUMENTS

| | | | |
|---|---|---|---|
| 8,664,119 B2* | 3/2014 | Yin et al. ....................... | 438/694 |
| 2012/0264281 A1* | 10/2012 | Chen et al. ................... | 438/591 |
| 2013/0249010 A1* | 9/2013 | Ng et al. ........................ | 257/369 |
| 2014/0035045 A1* | 2/2014 | Alptekin et al. .............. | 257/368 |
| 2015/0079780 A1* | 3/2015 | Liu et al. ...................... | 438/595 |

* cited by examiner

*Primary Examiner* — Bryan Junge
(74) *Attorney, Agent, or Firm* — Anova Law Group, PLLC

(57) ABSTRACT

Various embodiments provide transistors and methods for forming the same. In an exemplary method, a substrate is provided, having a dummy gate structure including a dummy gate dielectric layer on the substrate and a dummy gate layer on the dummy gate dielectric layer. A dielectric layer is formed on the substrate and on sidewall surfaces of the dummy gate structure. A top surface of the dielectric layer is leveled with a top surface of the dummy gate structure. A barrier layer is formed on the dielectric layer for protecting the dielectric layer. The dummy gate layer and the dummy gate dielectric layer are removed, to form an opening in the dielectric layer without reducing a thickness of the dielectric layer. A gate dielectric layer is formed on sidewall surfaces and a bottom surface of the opening. A gate layer is formed on the gate dielectric layer to fill the opening.

16 Claims, 5 Drawing Sheets

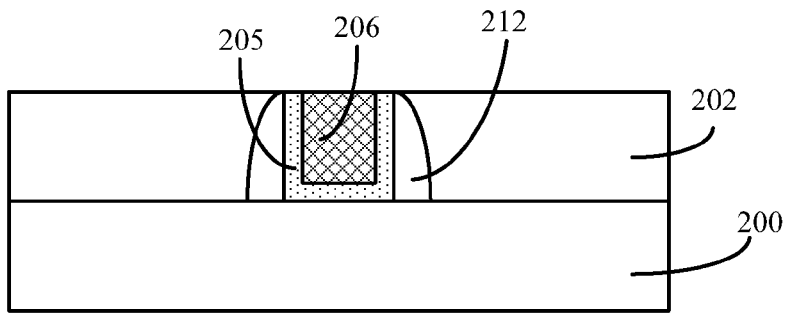

FIG. 10

| Provide a substrate having a dummy gate structure and a dielectric layer on the substrate and on the sidewall surfaces of the dummy gate structure, the dummy gate structure including a dummy gate dielectric layer on the substrate and a dummy gate layer on the dummy gate dielectric layer | S101 |

| Form a barrier film on the dielectric layer and the dummy gate structure, the thickness of the barrier film on the dielectric layer being greater than the thickness of the barrier film on the dummy gate layer | S102 |

| Etch the barrier film until the dummy gate layer is exposed, to form a first barrier layer on the dielectric layer | S103 |

| Optionally, repeatedly perform a deposition-etching process, to form a second barrier layer on the dielectric layer | S104 |

| After the second barrier layer is formed, remove the dummy gate layer and the dummy gate dielectric layer, to form an opening in the dielectric layer | S105 |

| Form a gate dielectric layer on sidewall surfaces and bottom surface of the opening, and a gate layer on the gate dielectric layer to fill the opening | S106 |

FIG. 11

TRANSISTOR AND METHOD FOR FORMING THE SAME

CROSS-REFERENCES TO RELATED APPLICATIONS

This application claims priority to Chinese Patent Application No. CN201310617916.7, filed on Nov. 27, 2013, the entire contents of which are incorporated herein by reference.

FIELD OF THE DISCLOSURE

The present disclosure relates to the field of semiconductor fabrication and, more particularly, relates to transistors and methods for forming the same.

BACKGROUND

With rapid development of integrated circuit (IC) manufacturing technology, size of semiconductor devices in an IC, especially size of metal-oxide-semiconductor (MOS) devices, has been shrinking continuously in order to meet the miniaturization and integration requirement of IC development. During the continuous miniaturization of MOS transistor devices, existing process of using silicon oxide or silicon oxynitride as a gate dielectric layer is faced with challenges. A transistor formed by using silicon oxide or silicon oxynitride as the gate dielectric layer has problems such as increase of leakage current and diffusion of impurities. Thus, the threshold voltage of the transistor is often affected, and the performance of the semiconductor device is affected accordingly.

To solve the above problems, transistors formed using high-K gate dielectric layer and metal gate, i.e., high-K metal gate (HKMG) transistors, have been proposed (K refers to dielectric constant). A high-K metal gate transistor uses a high-K material to replace the commonly-used gate dielectric material such as silicon oxide or silicon oxynitride. Thus, at the same time of reducing the size of a transistor, the generated leakage current can be reduced, and the performance of the transistor can be improved.

In particular, FIG. 1 depicts a cross-sectional view of an existing high-K metal gate transistor. As shown in FIG. 1, the transistor includes a dielectric layer 105 and a gate structure 110 on the surface of a substrate 100. The top surface of the gate structure 110 is leveled with the top surface of the dielectric layer 105. The gate structure 110 includes a high-K gate dielectric layer 101 on the surface of the substrate 100, a metal gate 103 on the surface of the high-K gate dielectric layer 101, and sidewall spacers 104 on the surface of the substrate 100 at both sides of the high-K gate dielectric layer 101 and the metal gate 103. A source region/drain region 106 is located in the substrate 100 at both sides of the gate structure 110.

For illustrative purposes, FIG. 1 shows that the top of the sidewall spacers 104 is leveled with the top surface of the dielectric layer 105. In practice, the top of the sidewall spacers 104 is not necessarily always leveled with the top surface of the dielectric layer 105. Before the forming of the metal gate 103 and the high-K gate dielectric layer 101, the top of the sidewall spacers 104 is often not leveled with the top surface of the dielectric layer 105.

However, performance of the high-K metal gate transistor formed by the existing technology is often unstable. The disclosed methods and structures are directed to solve one or more problems set forth above and other problems.

BRIEF SUMMARY OF THE DISCLOSURE

One aspect of the present disclosure includes methods for forming a transistor. In an exemplary method, a substrate can be provided. A dummy gate structure can be formed on the substrate. The dummy gate structure can include a dummy gate dielectric layer on the substrate and a dummy gate layer on the dummy gate dielectric layer. A dielectric layer can be formed on the substrate and on sidewall surfaces of the dummy gate structure. A top surface of the dielectric layer can be substantially leveled with a top surface of the dummy gate structure. A barrier layer can be formed on the dielectric layer for protecting the dielectric layer. After forming the barrier layer, the dummy gate layer and the dummy gate dielectric layer can be removed, to form an opening in the dielectric layer without reducing a thickness of the dielectric layer. A gate dielectric layer can be formed on sidewall surfaces and a bottom surface of the opening. A gate layer can be formed on the gate dielectric layer to fill the opening.

Another aspect of the present disclosure includes transistors. An exemplary transistor can include a substrate and a gate structure on the substrate. The gate structure can include a gate dielectric layer on the substrate and a gate layer on the gate dielectric layer. The exemplary transistor can further include a dielectric layer on the substrate and on sidewall surfaces of the gate structure. A top surface of the dielectric layer can be substantially leveled with a top surface of the gate structure. The gate structure can be formed using a process including the following steps. A dummy gate structure can be formed on the substrate. The dummy gate structure can include a dummy gate dielectric layer on the substrate and a dummy gate layer on the dummy gate dielectric layer. The dielectric layer can be located on the substrate and on sidewall surfaces of the gate structure. The top surface of the dielectric layer can be substantially leveled with a top surface of the dummy gate structure. A barrier layer can be formed on the dielectric layer for protecting the dielectric layer. After forming the barrier layer, the dummy gate layer and the dummy gate dielectric layer can be removed, to form an opening in the dielectric layer without reducing a thickness of the dielectric layer. The gate dielectric layer can be formed on sidewall surfaces and a bottom surface of the opening. The gate layer can be formed on the gate dielectric layer to fill the opening.

Other aspects or embodiments of the present disclosure can be understood by those skilled in the art in light of the description, the claims, and the drawings of the present disclosure.

BRIEF DESCRIPTION OF THE DRAWINGS

FIGS. 5-10 depict cross-sectional views of an exemplary transistor at various stages during fabrication in accordance with various disclosed embodiments;

FIG. 11 depicts a flow diagram of an exemplary method for forming a transistor in accordance with various disclosed embodiments.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
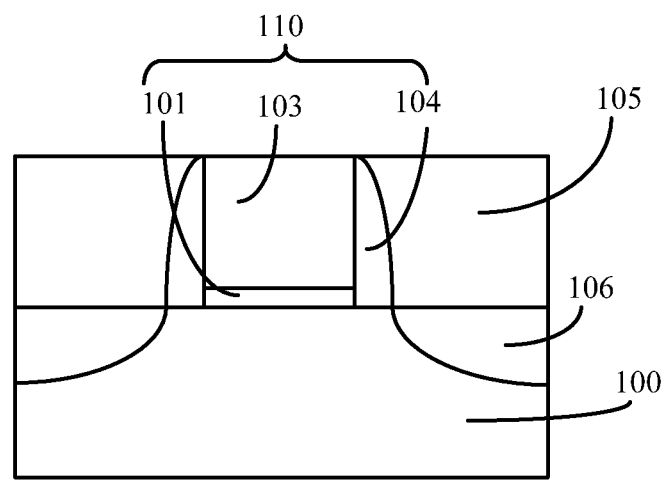
FIG. 1 depicts a cross-sectional view of a high-K metal gate transistor.
Figure 2:
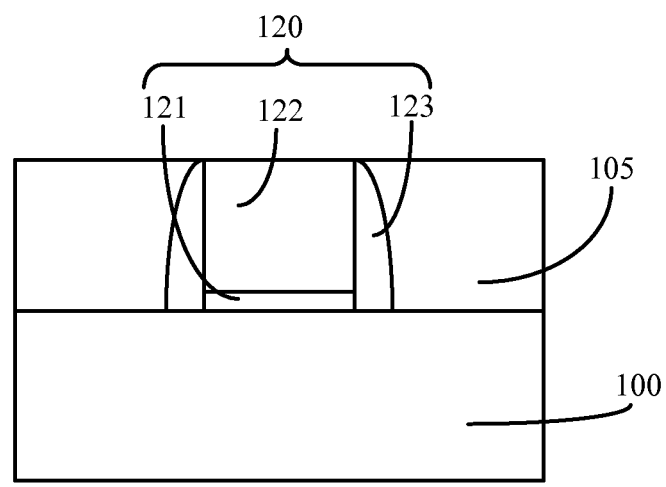
FIGS. 2-4 depict cross-sectional views of a gate structure at various stages of a fabrication process.
Figure 3:
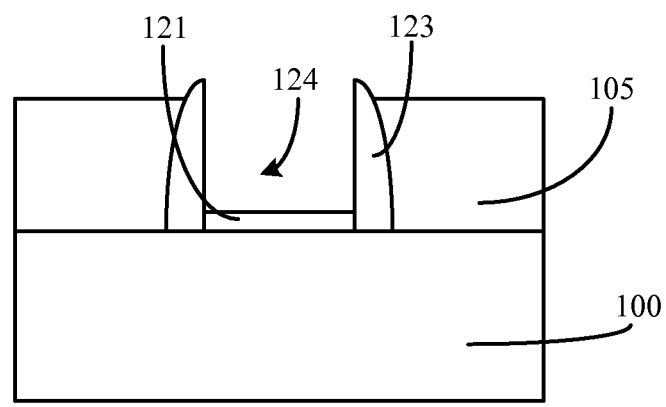
Figure 4:
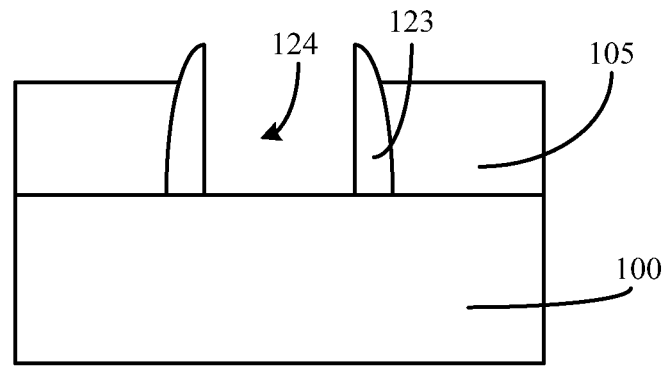

Performance of a high-K metal gate transistor formed by existing technology is often unstable. It is found that, an existing process for forming a high-K metal gate transistor is a gate-last process, and the gate-last process can affect or damage the size of the gate structure that is formed. For example, FIGS. 2-4 depict cross-sectional views of a gate structure at various stages of a fabrication process. For example, the fabrication process can be used for forming the gate structure 110 as shown in FIG. 1.

Referring to FIG. 2, a substrate 100 is provided. A dummy gate structure 120 is on the surface of the substrate 100. The dummy gate structure 120 includes a dummy gate dielectric layer 121 on the surface of the substrate 100, a dummy gate layer 122 on the surface of the dummy gate dielectric layer 121, and sidewall spacers 123 on the surface of the substrate 100 at both sides of the dummy gate layer 122 and the dummy gate dielectric layer 121. Further, the substrate 100 has a dielectric layer 105 on the surface of the substrate 100. The surface of the dielectric layer 105 is leveled with the surface of the dummy gate layer 122. The sidewall spacers 123 as shown in FIGS. 2-4 are similar to the same as the sidewall spacers 104 as shown in FIG. 1.

Referring to FIG. 3, the dummy gate layer 122 (as shown in FIG. 2) is removed. An opening 124 is formed within the dielectric layer 105. Referring to FIG. 4, the dummy gate dielectric layer 121 (as shown in FIG. 3) at the bottom of the opening 124 is removed.

The dummy gate layer 122 is often made of a material such as, e.g., polysilicon. The substrate 100 is often a silicon substrate. Thus, the etching selectivity between the dummy gate layer 122 and the substrate 100 is relatively poor. During the removal of the dummy gate layer 122, the dummy gate dielectric layer 121 can protect the surface of the substrate 100 from damage. After the removal of the dummy gate layer 122, the dummy gate dielectric layer 121 needs to be removed to expose the surface of the substrate 100, such that a gate dielectric layer can subsequently be formed on the surface of the substrate 100. In order to make the dummy gate dielectric layer 121 easy to form, easy to remove, and thus not leave residue attached to the surface of the substrate 100, the dummy gate dielectric layer 121 is made of a material such as silicon oxide.

However, in order to make the dielectric layer 105 easy to form, the dielectric material layer 105 is often made of silicon oxide as well. In addition, the silicon oxide is generally porous, such that the dielectric layer 105 has desired electrical isolation capability. Because both the dummy gate dielectric layer 121 and the dielectric layer 105 are made of silicon oxide, during the removal of the dummy gate dielectric layer 121, the thickness of the dielectric layer 105 can be reduced, i.e., thinned. Further, the thickness of the dielectric layer 105 can determine the thickness of a subsequently-formed metal gate. Therefore, when the thickness of the dielectric layer 105 is reduced, the thickness of the subsequently-formed metal gate can be reduced accordingly. Thus, the size of the formed metal gate can be difficult to control accurately. The performance of the formed transistor can be affected.

In order to solve the one or more problems set forth above and other problems, various embodiments provide methods for forming a transistor. In an exemplary method, before removing a dummy gate layer, a barrier film can be formed on the surface of a dielectric layer and the surface of a dummy gate structure. Further, the thickness of the barrier film on the dielectric layer can be greater than the thickness of the barrier film on the dummy gate structure, i.e., on the dummy gate layer. Thus, after the barrier film on the dummy gate layer is subsequently removed by an etching process, a portion of the barrier film can remain on the dielectric layer. During the subsequent removing of the dummy gate layer and the dummy gate dielectric layer, the barrier film on the dielectric layer can protect the dielectric layer from being thinned. Therefore, it can be ensured that the thickness of the dielectric layer can be accurate and easy to control. The thickness of a gate layer that is subsequently formed in the opening can thus be precisely controlled. Thus, performance of the formed transistor can be stable.

FIG. 11 depicts a flow diagram of an exemplary method (or process) for forming a transistor in accordance with various disclosed embodiments. FIGS. 5-10 depict cross-sectional views of the transistor at various stages during fabrication in accordance with various disclosed embodiments. Note that although FIGS. 5-10 depict structures corresponding to the method depicted in FIG. 11, the structures and the method are not limited to one another in any manner.

Figure 5:
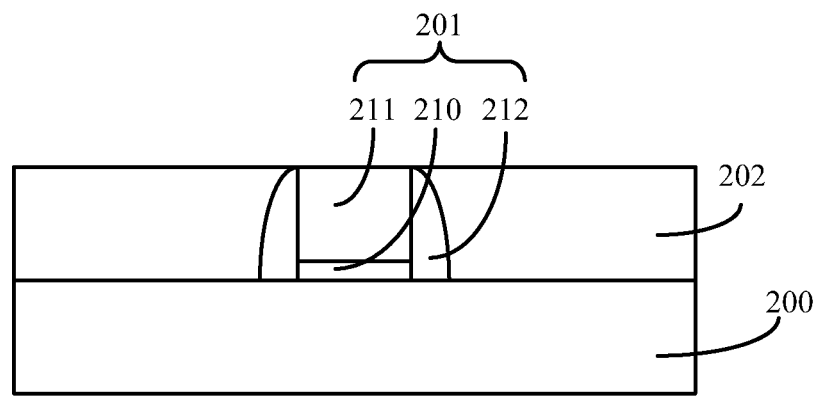

In Step S101 of FIG. 11 and referring to FIG. 5, a substrate 200 is provided. The substrate 200 has a dummy gate structure 201 on the surface of the substrate 200. The dummy gate structure 201 can include an optional dummy gate dielectric layer 210 on the surface of the substrate 200, and a dummy gate layer 211 on the surface of the dummy gate dielectric layer 210. A dielectric layer 202 can be located on the surface of the substrate 200 and on the sidewall surface(s) of the dummy gate structure 201. The surface (i.e., the top surface) of the dielectric layer 202 can be substantially leveled with the surface (i.e., the top surface) of the dummy gate structure 201.

The substrate 200 can include, e.g., a silicon substrate, a silicon-germanium substrate, a silicon carbide substrate, a silicon-on-insulator (SOI) substrate, a germanium-on-insulator (GOI) substrate, a glass substrate, or a III-V Group compound substrate (containing, e.g., silicon nitride, gallium arsenide, and/or the like). In one embodiment, a high-K metal gate transistor can be formed at the surface of the substrate 200. The high-K metal gate transistor can be formed using a gate-last process.

In one embodiment, the dummy gate structure 201 can further include sidewall spacers 212 on the surface of the substrate 200 on both sides of the dummy gate layer 211 and the dummy gate dielectric layer 210. The sidewall spacers 212 can be made of a material that is different from the material that the dielectric layer 202 or the dummy gate dielectric layer 210 is made of. The dummy gate dielectric layer 210 can be made of a material containing silicon oxide. The dummy gate layer 211 can be made of a material containing polysilicon. The sidewall spacers 212 can be made of a material containing one or more of silicon oxide, silicon nitride, and silicon oxynitride.

The dummy gate layer 211 can be used for occupying space for a subsequently-formed gate layer. The dummy gate layer 211 needs to be removed in a subsequent process, such that the gate layer can be formed at the location of the dummy gate layer 211 to complete the gate-last process. Optionally, the dummy gate dielectric layer 210 can be formed to protect the surface of the substrate 200 from damage during the subsequent removing of the dummy gate layer 211. After the dummy gate layer 211 is removed, the dummy gate dielectric layer 210 can be removed. When the dummy gate dielectric layer 210 is made of a material containing silicon oxide, a process for forming the dummy gate dielectric layer 210 can be simple, and the dummy gate dielectric layer 210 can be easy to remove.

After the dummy gate structure 201 is formed on the substrate 200, the substrate 200 at both sides of the dummy gate structure 201 can be doped with P-type ions or N-type ions to form a source region and a drain region. After the source region and the drain region are formed, the dielectric layer 202 can be formed on the surface 200.

In one embodiment, the dielectric layer 202 can be made of a material containing silicon oxide. For example, a process for forming the dielectric layer 202 can include the following steps. A dielectric film can be formed on the surface of the substrate 200 and the surface of the dummy gate structure 201, by using a deposition process. The dielectric film can be polished using a polishing process, until the top surface of the dummy gate structure 201 is exposed. The dielectric film remaining on the substrate 200 can form the dielectric layer 202. In another embodiment, the dielectric layer 202 can be made of a material containing silicon nitride, silicon oxynitride, and/or a low-K dielectric material.

After the polishing process, the surface of the dielectric layer 202 can be substantially leveled with the top surface of the dummy gate structure 201. Thus, the dielectric layer 202 can retain the location and structure of the dummy gate structure 201. After the dummy gate layer 211 is subsequently removed, an opening retaining the structure of the dummy gate layer 211 can be formed in the dielectric layer 202. The opening can be used for forming the gate layer using a metal.

However, the dummy gate layer 211 and the dummy gate dielectric layer 210 need to be subsequently removed using an etching process. The etching process tends to cause damage to the dielectric layer 202. For example, the etching process tends to reduce the thickness of the dielectric layer 202. Thus, the size of the gate layer subsequently formed in the opening can be difficult to control. Therefore, in various embodiments, before the dummy gate layer 211 and the dummy gate dielectric layer 210 are removed, a barrier layer can be formed on the surface of the dielectric layer 202 to protect the dielectric layer 202 from damage.

Figure 6:
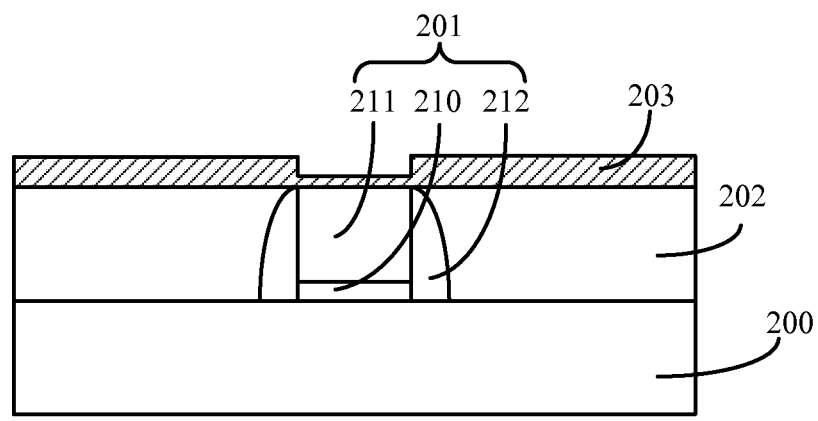

In Step S102 of FIG. 11 and referring to FIG. 6, a barrier film 203 is formed on the surface of the dielectric layer 202 and the surface of the dummy gate structure 201. The thickness of the barrier film 203 on the dielectric layer 202 can be greater than the thickness of the barrier film 203 on the dummy gate layer 211.

The barrier film 203 can be made of a material that is different from the material that the dummy gate layer 211 or the material that the dummy gate dielectric layer 210 is made of. Thus, during the subsequent removing of the dummy gate layer 211 and the dummy gate dielectric layer 210, the barrier film 203 can protect the dielectric layer 202. In one embodiment, the barrier film 203 can be made of a material containing, e.g., silicon nitride, hafnium oxide, aluminum oxide, and/or silicon oxide.

A process for forming the barrier film 203 can include, e.g., an atomic layer deposition (ALD) process. The ALD process can have different deposition rates on the surface of different materials, respectively. The dielectric layer 202 can be made of a material that is different from the material that the dummy gate layer 211 is made of. Therefore, the ALD process can form the barrier film 203, and the thickness of the barrier film 203 on the dielectric layer 202 can be different from the thickness of the barrier film 203 on the dummy gate layer 211. However, the process for forming the barrier film 203 is not limited to ALD process, and can include any appropriate process that have different deposition rates on the surface of different materials to accomplish the methods disclosed in various embodiments.

In one embodiment, the dummy gate layer 211 can be made of a material containing polysilicon. The dielectric layer 202 can be made of a material containing silicon oxide. The deposition rate of the ALD process on the dielectric layer 202 can be greater than the deposition rate of the ALD process on the dummy gate layer 211. Therefore, the barrier film 203 formed on the dielectric layer 202 can have a relatively great thickness. The barrier film 203 formed on the dummy gate layer 211 can have a relatively small thickness.

The thickness of the barrier film 203 formed on the dielectric layer 202 can be greater than the thickness of the barrier film 203 formed on the dummy gate layer 211. Thus, the barrier film 203 on the dummy gate layer 211 can be subsequently removed by an etching process. Meanwhile, the barrier film 203 on the dielectric layer 202 can be retained. Therefore, during the subsequent removing of the dummy gate layer 211 and the dummy gate dielectric layer 210, the barrier film 203 remaining on the dielectric layer 202 can protect the surface of the dielectric layer 202.

An ALD process can include repeatedly performing an ALD cycle for one or more times. When the barrier film 203 is made of hafnium oxide, the barrier film 203 can be formed by repeatedly performing an ALD cycle for from about 2 times to about 50 times, i.e., performing from about 2 to about 50 ALD cycles. That is, the barrier film 203 can be formed by repeatedly performing one or more ALD cycles, and the number of one or more ALD cycles can range from about 2 times to about 50 times. The thickness of the barrier film 203 formed by each ALD process can be less than or about 1 nm.

For example, parameters of an ALD cycle of an ALD process can include the following. A first precursor can be passed, i.e., pulsed, into a process chamber, to form an adsorbed layer on the surface of the dielectric layer 202 and the surface of the dummy gate layer 211. Residue of the first precursor and a first reaction product can be discharged. A second precursor can be pulsed, into the process chamber. The second precursor can react with the adsorbed layer to form the barrier film 203. The thickness of the barrier film 203 on the dielectric layer 202 can be greater than the thickness of the barrier film 203 on the dummy gate layer 211. Residue of the second precursor and a second reaction product can then be discharged.

The first precursor can contain water or ozone. The flow rate of the first precursor can range from about 1 sccm to about 300 sccm. The pulse time of the first precursor can range from about 0.01 second to about 10 seconds. The second precursor can contain hafnium tetrachloride, zirconium tetrachloride, and/or trimethyl aluminum. The flow rate of the second precursor can range from about 1 sccm to about 300 sccm. The pulse time of the second precursor can range from about 0.01 second to about 10 seconds.

In one embodiment, after a barrier film 203 is formed by an ALD process including one or more ALD cycles, the barrier film 203 can subsequently be etched using an etching process, until the surface of the dummy gate dielectric layer 211 is exposed, i.e., the barrier film 203 on the dummy gate layer 211 can be substantially removed. A first barrier layer can thus be formed on the dielectric layer 202. That is, after the barrier film 203 on the dummy gate layer 211 is removed, the barrier film 203 remaining on the dielectric layer 202 can form a first barrier layer.

After the etching process, the ALD process and the etching process can be repeatedly performed, until the thickness of the barrier layer, i.e., a second barrier layer formed on the dielectric layer 202, reaches a preset size. As used herein, 'preset size' can also be referred to as 'preset barrier layer thickness'.

In this case, the preset barrier layer thickness can range from about 2 nm to about 10 nm. Because the second barrier layer can be formed by repeatedly performing the ALD process and the etching process, the thickness of the formed second barrier layer can be more easily controlled. Thus, protection ability of the formed second barrier layer can be ensured. During the subsequent removing of the dummy gate layer 211 and the dummy gate dielectric layer 210, the second barrier layer can be prevented from being completely removed.

In another embodiment, a barrier film 203 can be formed by repeatedly performing an ALD cycle for multiple times, until the thickness of the barrier film 203 on the dielectric layer 202 is greater than a preset barrier film thickness. In addition, the thickness of the barrier film 203 needs to ensure that, after a subsequent process of etching the barrier film 203, the thickness of a formed barrier layer (i.e., a first barrier layer) can be a preset size, i.e., can reach a certain preset barrier layer thickness.

In this case, in one example, the preset barrier layer thickness can range from about 2 nm to about 10 nm. In another example, the preset barrier film thickness can range from about 2 nm to about 10 nm, and the preset barrier layer thickness can be any appropriate amount of thickness according to actual needs.

Further, in this case, when the thickness of the barrier film 203 formed by performing multiple ALD cycles is greater than the preset barrier film thickness, a thickness ratio between the thickness of the barrier film 203 on the dielectric layer 202 and the thickness of the barrier film 203 on the dummy gate layer 211 can range from about 5:1 to about 2:1. Subsequently, by using one etching process, the dummy gate layer 211 can be exposed and the first barrier layer can be formed. The barrier film 203 remaining on the dielectric layer 202 after the etching process can form a barrier layer. In this case, the barrier layer is the first barrier layer. Thus, the process can be relatively simple.

Figure 7:
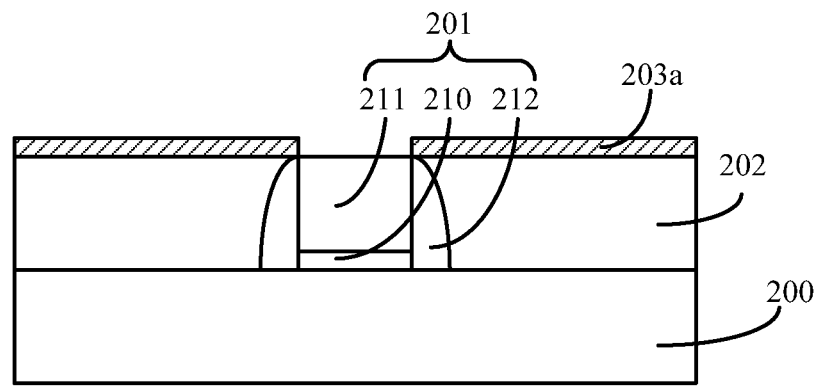

In Step S103 of FIG. 11 and referring to FIG. 7, the barrier film 203 (as shown in FIG. 6) is etched until the surface of the dummy gate layer 211 is exposed, to form a first barrier layer 203a on the surface of the dielectric layer 202. Because the thickness of the barrier film 203 on the dielectric layer 202 is greater than the thickness of the barrier film 203 on the dummy gate layer 211, when the barrier film 203 is etched until the surface of the dummy gate layer 211 is exposed, there can still be a remaining portion of the barrier film 203 on the dielectric layer 202 to form a first barrier layer 203a. The first barrier layer 203a can be used for protecting the surface of the dielectric layer 202 from damage during the subsequent removing of the dummy gate layer 211 and the dummy gate dielectric layer 210. Thus, desired morphology and accurate size of the subsequently-formed gate layer can be ensured.

For example, a process for etching the barrier film 203 can include an anisotropic dry etching process. The anisotropic dry etching process can have the same etching rate in a direction perpendicular to the surface of the substrate 200, such that the first barrier layer 203a can be formed on the dielectric layer 202 at the same time when the dummy gate layer 211 is exposed.

In one embodiment, a process for etching the barrier film 203 can include a pulsed dry etching process. The pulsed dry etching process can be used for etching a relatively small etching depth. In addition, the etching depth can be precisely controlled. Because the thickness of the formed barrier film 203 can be relatively small, when the pulsed dry etching process is used, the process for etching can be precisely controlled in order to expose the surface of the dummy gate layer 211. Meanwhile, the first barrier layer 203a can remain on the dielectric layer 202. That is, the completely removing of the barrier film 203 on both of the dielectric layer 202 and the dummy gate layer 211 due to excessively high etching rate may not easily occur.

For example, parameters of the pulsed dry etching process can include the following. The plasma source power can range from about 500 watts to about 2000 watts. The bias power can range from about 200 watts to about 1500 watts. The pulse frequency of the plasma source power and the pulse frequency of the bias power can be synchronous or asynchronous. The pulse frequency of the plasma source power and/or the pulse frequency of the bias power can range from about 50 Hz to about 20 kHz. The duty cycle of the pulse frequency of the plasma source power and/or the pulse frequency of the bias power can range from about 10% to about 90%. The pressure can range from about 1 mTorr to about 50 mTorr. The gas, i.e., the etching gas, can contain Ar, He, $Cl_2$, HBr, $CF_4$, and/or $CHF_3$. The flow rate of the Ar can range from about 10 sccm to about 500 sccm. The flow rate of the He can range from about 10 sccm to about 500 sccm. The flow rate of the $Cl_2$ can range from about 50 sccm to about 200 sccm. The flow rate of the HBr can range from about 20 sccm to about 500 sccm. The flow rate of the $CF_4$ can range from about 10 sccm to about 150 sccm. The flow rate of the $CHF_3$ can range from about 10 sccm to about 200 sccm.

Figure 8:
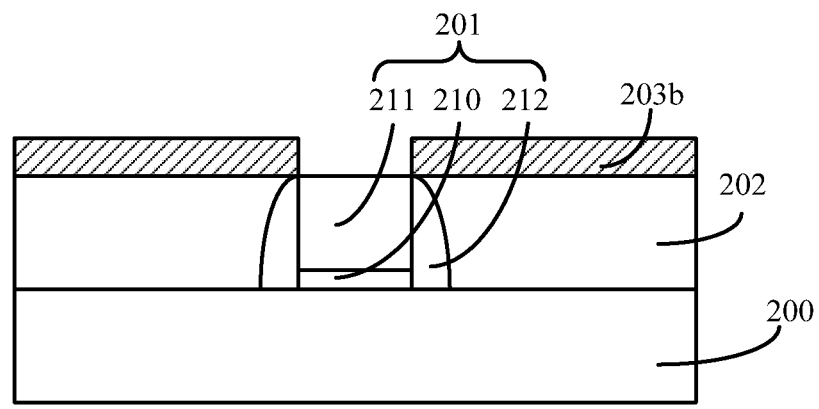

In Step S104 of FIG. 11 and referring to FIG. 8, optionally, after the first barrier layer 203a is formed, a barrier film is formed on the surface of the first barrier layer 203a and the surface of the dummy gate layer 211. The barrier film is etched until the surface of the dummy gate layer 211 is exposed. The steps of forming the barrier film and etching the barrier film until the surface of the dummy gate layer 211 is exposed can be repeatedly performed, until a second barrier layer 203b formed on the surface of the dielectric layer 202 reaches a preset barrier layer thickness. Thus, the second barrier layer 203b can form, i.e., be used as, a barrier layer on the dielectric layer 202.

As described in various embodiments, a first barrier layer 203a (e.g., as in FIGS. 6-7) can be formed by a deposition-etching process. The deposition-etching process can include forming a barrier film, and etching the barrier film until the surface of the dummy gate layer 211 is exposed. When the first barrier layer 203a is previously formed on the dielectric layer, the deposition-etching process can include forming a barrier film on the first barrier layer 203a and the dummy gate layer 211, and etching the barrier film until the surface of the dummy gate layer 211 is exposed. When the first barrier layer 203a is not yet formed on the dielectric layer 202, the deposition-etching process can include forming a barrier film on the dielectric layer 202 and the dummy gate layer 211, and etching the barrier film until the surface of the dummy gate layer 211 is exposed. During each deposition-etching process, the thickness of the barrier film formed on the dielectric layer 202 (or the previously formed first barrier layer 203a) can be greater than the thickness of the barrier film formed on the dummy gate layer 211. Thus, after etching the barrier film until the surface of the dummy gate layer 211 is exposed, a portion of the barrier film can remain on the dielectric layer 202 (or the previously formed first barrier layer 203a), to form a first barrier layer 203a on the dielectric layer 202 (or the previously formed first barrier layer 203a).

In one embodiment, the deposition-etching process can be repeatedly performed, until a second barrier layer 203b formed on the surface of the dielectric layer 202 reaches a preset barrier layer thickness. In other words, the second barrier layer 203b can include multiple first barrier layers 203a, which may be desired when a thickness of a single barrier layer 203a cannot be formed in one deposition-etching process, or when multiple deposition-etching processes may improve characteristics of the barrier layer 203b. The second barrier layer 203b is thus used as the barrier layer. In another embodiment, the deposition-etching process is performed once (e.g., as shown in FIGS. 6-7). In this case, the first barrier layer 203a is formed. Thus, the first barrier layer 203a can form, i.e., be used as, the barrier layer.

In one embodiment, the second barrier layer 203b that reaches the preset barrier layer thickness can be formed by repeatedly performing, for more than one time, the ALD process and the etching process following the ALD process. Thus, the thickness of the formed second barrier layer 203b can be more accurate and easier to control. The preset barrier layer thickness can range from about 2 nm to about 10 nm.

Each barrier film 203 can be made of a material containing silicon nitride, hafnium oxide, aluminum oxide, and/or silicon oxide. The process for forming the each barrier film can include the ALD process. The ALD process can include one or more ALD cycles. When the barrier film is made of hafnium oxide, each layer of barrier film can be formed by repeatedly performing an ALD cycle for from about 2 times to about 50 times. The thickness of the barrier film 203 formed by each ALD cycle can be less than or about 1 nm.

An ALD cycle of an ALD process can include the following steps. A first precursor can be pulsed into a process chamber, to form an adsorbed layer on the surface of the first barrier layer 203a and the surface of the dummy gate layer 211. Residue of the first precursor and a first reaction product can be discharged. A second precursor can be pulsed, into the process chamber. The second precursor can react with the adsorbed layer to form the barrier film 203. The thickness of the barrier film 203 on the first barrier layer 203a can be greater than the thickness of the barrier film 203 on the dummy gate layer 211. Residue of the second precursor and a second reaction product can then be discharged.

The first precursor can contain water or ozone. The flow rate of the first precursor can range from about 1 sccm to about 300 sccm. The pulse time of the first precursor can range from about 0.01 second to about 10 seconds. The second precursor can contain hafnium tetrachloride, zirconium tetrachloride, and/or trimethyl aluminum. The flow rate of the second precursor can range from about 1 sccm to about 300 sccm. The pulse time of the second precursor can range from about 0.01 second to about 10 seconds.

When the barrier film 203 and the dummy gate dielectric layer 210 (or the dummy gate layer 211) are made of the same material, the thickness of the formed second barrier layer 203b may need to be greater than the thickness of the dummy gate dielectric layer 210 (or the dummy gate layer 211), in order to ensure that, during the removing of the dummy gate dielectric layer 210 (or the dummy gate layer 211), the second barrier layer 203b is not completely removed.

The process for etching each layer of the barrier films can include an anisotropic dry etching process. In one embodiment, the process for etching each layer of the barrier films can include a pulsed dry etching process.

The pulsed dry etching process can include the following parameters. The plasma source power can range from about 500 watts to about 2000 watts. The bias power can range from about 200 watts to about 1500 watts. The pulse frequency of the plasma source power and the pulse frequency of the bias power can be synchronous or asynchronous. The pulse frequency of the plasma source power and/or the pulse frequency of the bias power can range from about 50 Hz to about 20 kHz. The duty cycle of the pulse frequency of the plasma source power and/or the pulse frequency of the bias power can range from about 10% to about 90%. The pressure can range from about 1 mTorr to about 50 mTorr. The gas, i.e., the etching gas can contain Ar, He, $Cl_2$, HBr, $CF_4$, and/or $CHF_3$. The flow rate of the Ar can range from about 10 sccm to about 500 sccm. The flow rate of the He can range from about 10 sccm to about 500 sccm. The flow rate of the $Cl_2$ can range from about 50 sccm to about 200 sccm. The flow rate of the HBr can range from about 20 sccm to about 500 sccm. The flow rate of the $CF_4$ can range from about 10 sccm to about 150 sccm. The flow rate of the $CHF_3$ can range from about 10 sccm to about 200 sccm.

By repeatedly performing the steps of forming the barrier film and etching the barrier film until the dummy gate layer 211 is exposed, the thickness of the formed second barrier layer 203b can be more accurate and precise and can meet design criteria. Thus, protection ability of the second barrier layer 203b can be ensured during the subsequent removing of the dummy gate layer 211 and the dummy gate dielectric layer 210.

Figure 12:
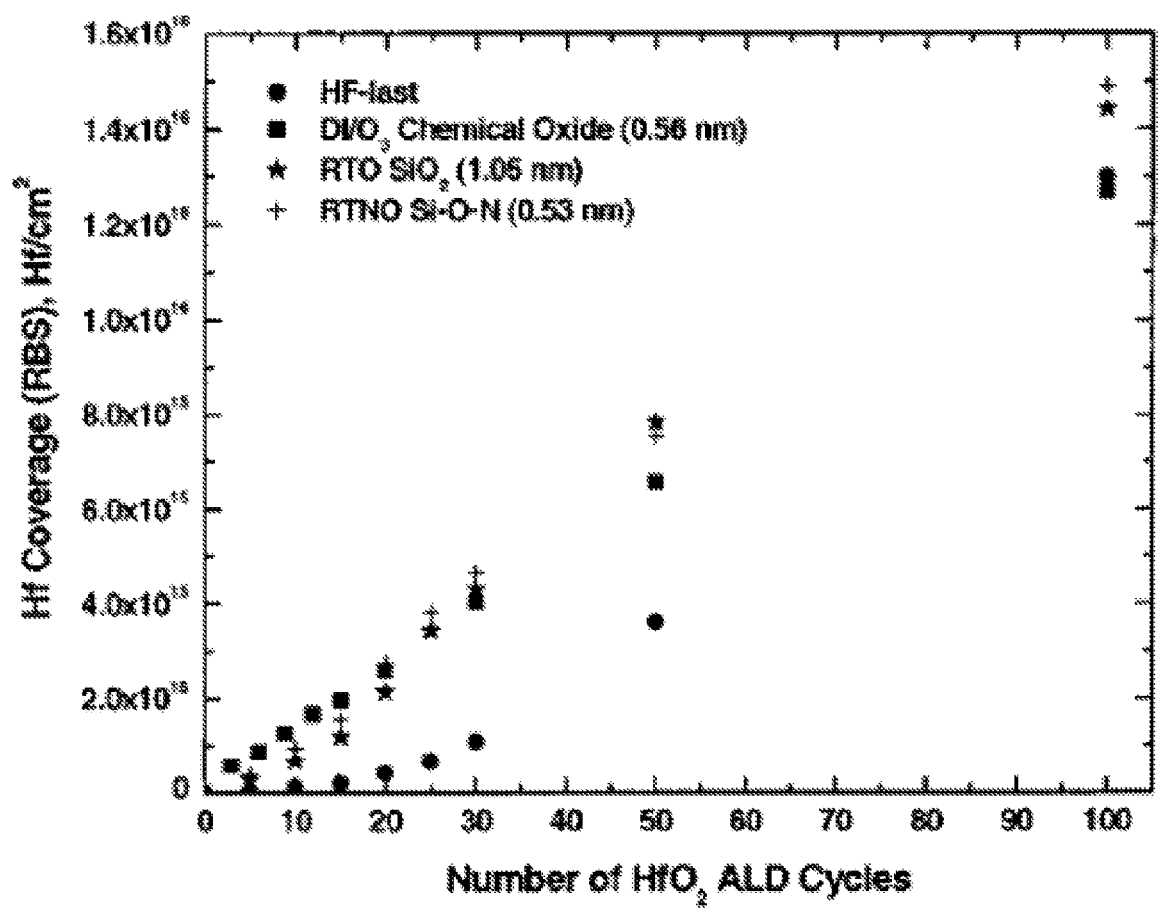
FIG. 12 depicts a coverage rate of a hafnium oxide layer on different substrates as a function of a number of repeating times of an ALD reaction cycle in accordance with various disclosed embodiments.

FIG. 12 depicts a coverage rate of a hafnium oxide layer on different substrates as a function of a number of repeating times of an ALD reaction cycle in accordance with various disclosed embodiments. FIG. 12 compares a coverage rate of a hafnium oxide layer formed on different substrates as a function of a number of repeating times for introducing a first precursor and a second precursor in an ALD process. The different substrates as shown in FIG. 12 include a rapid thermal nitride oxide (RTNO) Si—O—N substrate, a rapid thermal oxidation (RTO) $SiO_2$ substrate, substrate having chemical oxide formed by DI/O3 (ozone dissolved in deionized water), and a substrate (e.g., a silicon substrate for an Hf-last process, i.e., a gate last process using hafnium oxide as a gate dielectric layer). Specifically, the horizontal axis in FIG. 12 indicates the number of repeating times for repeatedly performing an ALD cycle. Each ALD cycle may include introducing the first precursor and the second precursor. The vertical axis in FIG. 12 indicates a coverage rate of the hafnium oxide layer characterized by the number of hafnium (Hf) atoms per square centimeter on a substrate. Therefore, as shown by FIG. 12 and other related data of ALD deposition (not shown), the thickness of the barrier film on the dielectric layer 202 can be greater than the thickness of the barrier film on the dummy gate layer 211.

As shown in FIG. 12, with low number of repeating times for performing ALD cycles, the coverage rate of the hafnium oxide layer on the silicon substrate is much lower than the coverage rate of the hafnium oxide layer on the silicon oxide substrate. As the number of repeating times for repeatedly performing the ALD cycles increases, a coverage rate difference between the hafnium oxide layer on the silicon substrate and the hafnium oxide layer on the silicon oxide substrate is gradually reduced. In ALD processes, thickness of the hafnium oxide layer is directly related to the coverage rate of the hafnium oxide layer. For example, the greater the coverage rate of the hafnium oxide layer, the greater the thickness of the hafnium oxide layer can be.

Based on FIG. 12 and any other appropriate data of ALD deposition process (not shown), the number of ALD cycles in each ALD process can be determined in order to maximize the difference between the thickness of the barrier film on the dielectric layer 202 and the thickness of the barrier film on the dummy gate layer 211. In the subsequent etching process, by knowing the etching rate for the barrier film and controlling the etching time, the barrier film on the dummy gate layer 211 can be removed while a portion of the barrier film on the dielectric layer 202 can remain. Thus, a first barrier layer 203a formed on the dielectric layer 202 can have a desired thickness. Further, the number of times for repeatedly performing the deposition-etching process can be determined such that the second barrier layer 203b formed on the surface of the dielectric layer 202 can reaches a preset barrier layer thickness.

Figure 9:
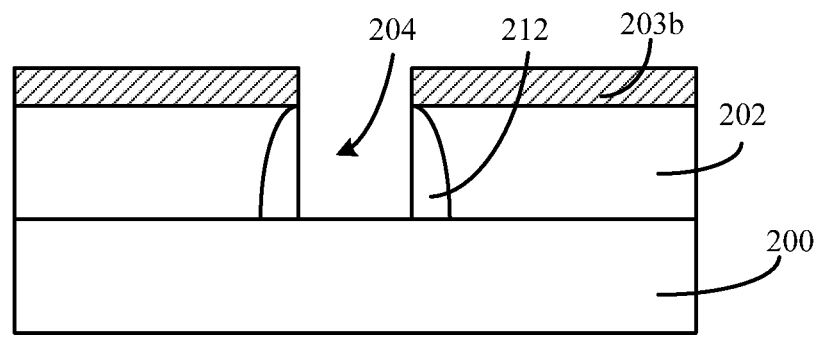

In Step S105 of FIG. 11 and referring to FIG. 9, after the second barrier layer 203b is formed, the dummy gate layer 211 and the dummy gate dielectric layer 210 are removed, to form an opening 204 in the dielectric layer 202.

A process for removing the dummy gate layer 211 and/or the dummy gate dielectric layer 210 can include a dry etching process and/or a wet etching process. The opening 204 can be used for forming a gate dielectric layer that is made of a high-K material, and for forming a gate layer that is made of a metal material. Thus, a high-K metal gate transistor can be formed.

The dummy gate layer 211 can be made of a material containing polysilicon. In one embodiment, the process for removing the dummy gate layer 211 can include a dry etching process. The dry etching process can have an etching gas containing chlorine, helium, hydrogen bromide, and/or a mixture of helium and oxygen. In another embodiment, the process for removing the dummy gate layer 211 can include a wet etching process. The wet etching process can have an etching liquid containing tetramethylammonium hydroxide. The tetramethylammonium hydroxide can have a mass percentage concentration in the etching liquid ranging from about 2% to about 4%. The etching temperature can range from about 50° C. to about 90° C.

The dummy gate dielectric layer 210 can be made of a material containing silicon oxide. In one embodiment, the process of removing the dummy gate dielectric layer 210 can include a dry etching process. The dry etching process can have an etching gas containing $CHF_3$, $CF_4$, HF, or a combination thereof. In another embodiment, the process of removing the dummy gate dielectric layer 210 can include a wet etching process. The wet etching process can have an etching liquid containing, e.g., hydrofluoric acid.

During the removing of the dummy gate layer 211 and the dummy gate dielectric layer 210, because the surface of the dielectric layer 202 is protected by the second barrier layer 203b, the thickness of the dielectric layer 202 is not reduced. That is, the depth of the formed opening 204 can be consistent with the thickness of the dummy gate layer 211 and the thickness of the dummy gate dielectric layer 210. Thus, the structure and size of the subsequently-formed gate dielectric layer and gate layer can be accurate, be easy to control, and meet the design criteria.

In Step S106 of FIG. 11 and referring to FIG. 10, a gate dielectric layer 205 is formed on sidewall surface(s) and the bottom surface of the opening 204 (as shown in FIG. 9). A gate layer 206 is formed on the surface of gate dielectric layer 205 to fill the opening 204.

The gate dielectric layer 205 can be made of a high-K material. The gate layer 206 can be made of a metal. The high-K material can contain, e.g., hafnium oxide, zirconium oxide, hafnium silicon oxide, lanthanum oxide, zirconium silicon oxide, titanium oxide, tantalum oxide, barium strontium titanium oxide, barium titanium oxide, strontium titanium oxide, and/or aluminum oxide. The metal can contain, e.g., copper, tungsten, aluminum, cobalt, nickel, or a combination thereof.

Optionally, a work function layer can be formed between the gate dielectric layer 205 and the gate layer 206. The work function layer can be made of a conductive material. The work function layer can be used for adjusting threshold voltage of the transistor. The material that the work function material layer is made of can be selected according to the type of the formed transistor, such that the formed transistor can be relatively more suitable for forming a P-type MOS (PMOS) transistor or an N-type MOS (NMOS) transistor.

For example, a process for forming the gate dielectric layer 205 and the gate layer 206 can include the following steps. For illustrative purposes, the barrier layer in this example is a second barrier layer 203b. A gate dielectric film can be formed on the surface of the protective layer, i.e., the second barrier layer 203b (e.g., as shown in FIG. 9), and on the sidewalls and the bottom surface of the opening 204. A gate film can be formed on the surface of the gate dielectric film. The gate dielectric film and the gate film can be polished using a polishing process, until the second barrier layer 203b is exposed.

The second barrier layer 203b is located on the surface of the dielectric layer 202 to protect the dielectric layer 202. Therefore, the size of the opening 204 can be accurate and can be precisely controlled. Accordingly, the size of the gate dielectric layer 205 and the gate layer 206 formed in the opening 204 can be accurate and can be precisely controlled. The performance of the formed transistor can thus be more stable.

For example, a process for forming the gate dielectric film and a gate film can include a chemical vapor deposition process and/or a physical vapor deposition process. The polishing process can include a chemical mechanical polishing (CMP) process.

In one embodiment, after the second barrier layer 203b is exposed, according to actual technical need, the second barrier layer 203b can be further polished using the polishing process, until the surface of the dielectric layer 202 is exposed. In another embodiment, after the second barrier layer 203b is exposed, the second barrier layer 203b can be retained for subsequent processes.

In various embodiments, before removing a dummy gate layer, a barrier film can be formed on the surface of a dielectric layer and the surface of a dummy gate structure. Further, the thickness of the barrier film on the dielectric layer can be greater than the thickness of the barrier film on the dummy gate layer. Thus, after the barrier film on the dummy gate layer is removed using a subsequent etching process, a portion of the barrier film can remain on the dielectric layer. During the subsequent removing of the dummy gate layer and the dummy gate dielectric layer, the barrier film on the dielectric layer can protect the dielectric layer from being thinned. Accordingly, it can be ensured that the thickness of the dielectric layer can be precisely and easily controlled, such that the thickness of the gate layer subsequently formed in the opening can be precisely controlled. Therefore, the performance of the formed transistor can be stable.

Various further processes can be used to form a transistor based on the high-K gate structure. An exemplary transistor is shown in FIG. 10. The transistor can include a substrate 200 having a dielectric layer 202 thereon. The dielectric layer 202 can have an opening (e.g., as the opening 204 shown in FIG. 9). A gate dielectric layer 205 can be formed on sidewall surface(s) and the bottom surface of the opening. A gate layer 206 can be formed on the surface of gate dielectric layer 205 to fill the opening. The gate dielectric layer 205 and the gate layer 206 can form a gate structure. The top surface of the dielectric layer 202 can be substantially leveled with a top surface of the gate structure. Optionally, the transistor can further include sidewall spacers 212 on the surface of the substrate 200 on both sides of the gate dielectric layer 205 and the gate layer 206. The substrate 200 at both sides of the gate structure can be doped with P-type or N-type ions to form a source region and a drain region (not shown). The gate dielectric layer 205 and the gate layer 206 can be formed using methods as described above in various embodiments, e.g., as shown in FIGS. 5-11. In various embodiments, the gate dielectric layer 205 can be made of a high-K material, and the gate layer 206 can be made of a metal.

In certain embodiments, methods for forming a transistor using a gate-last process are disclosed. The method can include the following exemplary steps.

A substrate can be provided. The substrate can have a dummy gate structure thereon. The dummy gate structure can include a dummy gate dielectric layer (or a gate oxide), and a dummy gate layer. A dielectric film can be formed on the surface of the substrate and the surface of the dummy gate structure by using a deposition process. The dielectric film can be polished using a CMP process, until the top surface of the dummy gate structure is exposed. The dielectric film remaining on the substrate can thus form the dielectric layer.

Next, a barrier film can be formed on the dielectric layer and on the dummy gate structure, using an ALD process. The thickness of the barrier film on the dielectric layer can be greater than the thickness of the barrier film on the dummy gate structure. The barrier film on the dummy gate structure can be removed by pulsing etch, e.g., by using a pulsed dry etching process, such that a portion of the barrier film can remain on the dielectric layer. The steps of forming the barrier film and removing the barrier film on the dummy gate structure can be repeatedly performed, such that a barrier layer is formed on the dielectric layer. The barrier layer can have a sufficient thickness in order to protect the dielectric layer in subsequent processes.

The dummy gate dielectric layer (or the gate oxide) and the dummy gate layer can then be removed to form an opening in the dielectric layer. A gate dielectric layer and a gate layer can then be formed in the opening. The gate dielectric layer can be made of a high-K material. The gate layer can be made of a metal material. A process for forming the gate dielectric layer and the gate layer can include the following steps. A gate dielectric film can be formed on the surface of the barrier layer and on the sidewalls and the bottom surface of the opening. A gate film can be formed on the surface of the gate dielectric film. The gate dielectric film and the gate film can be polished using a CMP process, until the barrier layer is exposed.

Optionally, the barrier film formed using the ALD process can be made of a material such as silicon nitride, hafnium oxide, and silicon oxide. Optionally, the ALD process can include one or more ALD cycles. The number of the one or more ALD cycles can range from about 2 to about 50.

Optionally, the pulsing etch can precisely control the thickness that is etched. The pulsing etch can remove the barrier film that is formed on the dummy gate structure using the ALD process, and the barrier layer having a certain thickness can be formed on the dielectric layer to protect the dielectric layer.

Optionally, the steps of forming the barrier film and removing the barrier film on the dummy gate structure can be repeatedly performed, such that the barrier layer formed on the dielectric layer can have a thickness ranging from about 2 nm to about 10 nm. Optionally, after the gate dielectric film and the gate film are polished using the CMP process until the barrier layer is exposed, the barrier layer on the dielectric layer can be removed or retained, depending on needs of subsequent processes.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A method for forming a transistor, comprising:
   providing a substrate;
   forming a dummy gate structure on the substrate, the dummy gate structure including a dummy gate dielectric layer on the substrate and a dummy gate layer on the dummy gate dielectric layer;
   forming a dielectric layer on the substrate and on sidewall surfaces of the dummy gate structure, a top surface of the dielectric layer being substantially leveled with a top surface of the dummy gate structure;
   forming a barrier film on the dielectric layer and the dummy gate structure, wherein a thickness of the barrier film on the dielectric layer is greater than a thickness of the barrier film on the dummy gate layer;
   etching the barrier film until the dummy gate layer is exposed, to form a barrier layer on the dielectric layer for protecting the dielectric layer;
   after forming the barrier layer, removing the dummy gate layer and the dummy gate dielectric layer, to form an opening in the dielectric layer without reducing a thickness of the dielectric layer;
   forming a gate dielectric layer on sidewall surfaces and a bottom surface of the opening; and
   forming a gate layer on the gate dielectric layer to fill the opening.

2. The method according to claim 1, wherein a process for forming the barrier film includes an atomic layer deposition (ALD) process, and a deposition rate of the ALD process on the dielectric layer is greater than a deposition rate of the ALD process on the dummy gate layer.

3. The method according to claim 2, wherein:
   the barrier film is formed by the ALD process until the thickness of the barrier film on the dielectric layer is greater than a preset barrier film thickness, wherein the ALD process includes a plurality of ALD cycles and the number of the plurality of ALD cycles ranges from about 2 to about 50; and after etching the barrier film, a thickness of the formed barrier layer is a preset barrier layer thickness.

4. The method according to claim 3, wherein, when the thickness of the barrier film on the dielectric layer is greater than the preset barrier film thickness, a thickness ratio between the thickness of the barrier film on the dielectric layer and the thickness of the barrier film on the dummy gate layer ranges from about 5:1 to about 2:1.

5. The method according to claim 3, wherein a thickness of the barrier film formed by performing each ALD cycle of the plurality of ALD cycles is less than or about 1 nm.

6. The method according to claim 1, wherein the barrier layer is made of a material containing silicon nitride, hafnium oxide, aluminum oxide, silicon oxide, or a combination thereof.

7. The method according to claim 1, wherein:
the dummy gate dielectric layer is made of a material containing silicon oxide;
the dielectric layer is made of a material containing silicon oxide; and
the dummy gate layer is made of a material containing polysilicon.

8. The method according to claim 1, wherein:
the gate dielectric layer is made of a high-K material; and
the gate layer is made of a metal material.

9. The method according to claim 8, wherein the forming of the gate dielectric layer and the forming of the gate layer includes:
forming a gate dielectric film on a surface of the barrier layer and on sidewalls and a bottom surface of the opening;
forming a gate film on the gate dielectric film to fill the opening; and
polishing the gate dielectric film and the gate film using a polishing process, until the barrier layer is exposed, to form the gate dielectric and the gate layer.

10. The method according to claim 9, further including:
after the barrier layer is exposed, polishing the barrier layer using the polishing process, until the dielectric layer is exposed.

11. The method according to claim 1, wherein the dummy gate structure further includes:
sidewall spacers on the substrate on both sides of the dummy gate layer and the dummy gate dielectric layer, wherein the sidewall spacers are made of a material that is different from a material that the dielectric layer or the dummy gate dielectric layer is made of.

12. The method according to claim 1, wherein before forming the barrier layer on the dielectric layer, the method further includes:
doping the substrate at both sides of the dummy gate structure with P-type ions or N-type ions to form a source region and a drain region.

13. A method for forming a transistor, comprising:
providing a substrate;
forming a dummy gate structure on the substrate, the dummy gate structure including a dummy gate dielectric layer on the substrate and a dummy gate layer on the dummy gate dielectric layer;
forming a dielectric layer on the substrate and on sidewall surfaces of the dummy gate structure, a top surface of the dielectric layer being substantially leveled with a top surface of the dummy gate structure;
performing a deposition-etching process including:
forming a barrier film on the dielectric layer and the dummy gate layer, such that a thickness of the barrier film on the dielectric layer is greater than a thickness of the barrier film on the dummy gate layer, and
etching the barrier film until the dummy gate layer is exposed, to form a first barrier layer on the dielectric layer;
repeatedly performing the deposition-etching process, such that barrier layer is formed on the dielectric layer for protecting the dielectric layer, wherein the barrier layer has a thickness reaching a preset barrier layer thickness;
after forming the barrier layer, removing the dummy gate layer and the dummy gate dielectric layer, to form an opening in the dielectric layer without reducing a thickness of the dielectric layer;
forming a gate dielectric layer on sidewall surfaces and a bottom surface of the opening; and
forming a gate layer on the gate dielectric layer to fill the opening.

14. The method according to claim 13, wherein the preset barrier layer thickness ranges from about 2 nm to about 10 nm.

15. The method according to claim 14, wherein a process for etching the barrier film includes a pulsed dry etching process.

16. The method according to claim 15, wherein a process for forming the barrier film includes an ALD process, wherein:
a deposition rate of the ALD process on the dielectric layer is greater than a deposition rate of the ALD process on the dummy gate layer; and
the ALD process includes a plurality of ALD cycles, and the number of the plurality of ALD cycles ranges from about 2 to about 50.

* * * * *